United States Patent [19]

Bahr et al.

[11] Patent Number: 5,227,676
[45] Date of Patent: Jul. 13, 1993

[54] CURRENT MODE SAMPLE-AND-HOLD CIRCUIT

[75] Inventors: Allen A. Bahr; Tony R. Larson, both of Tucson, Ariz.

[73] Assignee: International Business Machines Corporation, Armonk, N.Y.

[21] Appl. No.: 760,534

[22] Filed: Sep. 16, 1991

[51] Int. Cl.$^5$ .............................................. G11C 27/02
[52] U.S. Cl. ..................................... 307/353; 307/491; 307/494
[58] Field of Search ............... 307/351, 353, 491, 494; 328/151

[56] References Cited

U.S. PATENT DOCUMENTS

| | | | |
|---|---|---|---|
| 3,469,112 | 9/1969 | Hands et al. | 307/353 |
| 3,643,110 | 2/1972 | Thompson | 307/358 |
| 4,185,211 | 1/1980 | Kucharewski | 307/351 |
| 4,321,488 | 3/1982 | Srivastava | 307/353 |
| 5,004,935 | 4/1991 | Murayama et al. | 307/353 |
| 5,012,133 | 4/1991 | Hughes | 307/352 |
| 5,109,169 | 4/1992 | Hughes | 307/353 |

FOREIGN PATENT DOCUMENTS 2152098 12/1988 Japan .
1-279500 11/1989 Japan .

OTHER PUBLICATIONS

W. D. Pricer, "Blur Correction Circuit for Scanners" IBM Technical Disclosure Bulletin, vol. 17, No. 12, May 1975 pp. 3545-3547.

Primary Examiner—John Zazworsky
Attorney, Agent, or Firm—C. E. Rohrer; M. W. Schecter

[57] ABSTRACT

The current mode sample-and-hold circuit includes a differential amplifier having a non-inverting input coupled to a first leg of a current mirror from which a first current to be sampled is drawn. An inverting input of the differential amplifier is coupled to its output and further coupled to a capacitor through a sample hold switch. The first current drawn from the first leg of the current mirror causes the capacitor to charge, through the differential amplifier. The charged capacitor is coupled to the current mirror and biases the current mirror so as to provide the required first current. Opening the sample hold switch causes the capacitor to maintain a bias level determined by the first current. The bias signal in turn causes a mirrored current flowing in a second leg of the current mirror to be maintained, even in the absence of the first current. Thus an input current is sampled and a corresponding output current is provided. The capacitor operates in a feedback loop for improving accuracy. Furthermore, the capacitor is isolated from both the input and output providing high frequency capability. Alternatively, the sample hold switch may be replaced by a diode for providing a peak detector function.

22 Claims, 2 Drawing Sheets

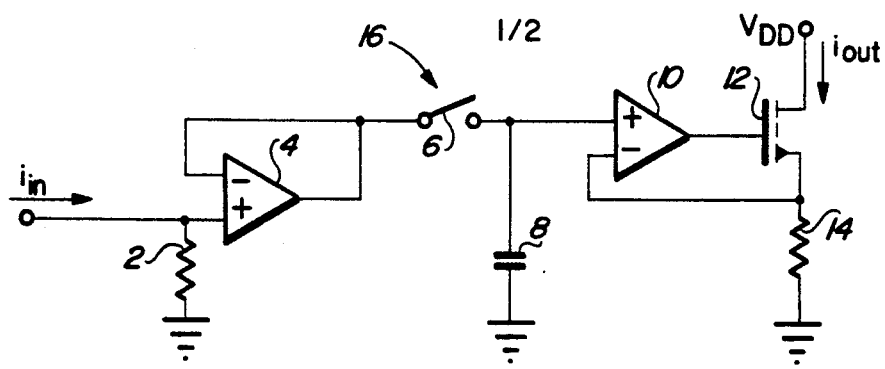
FIG-1
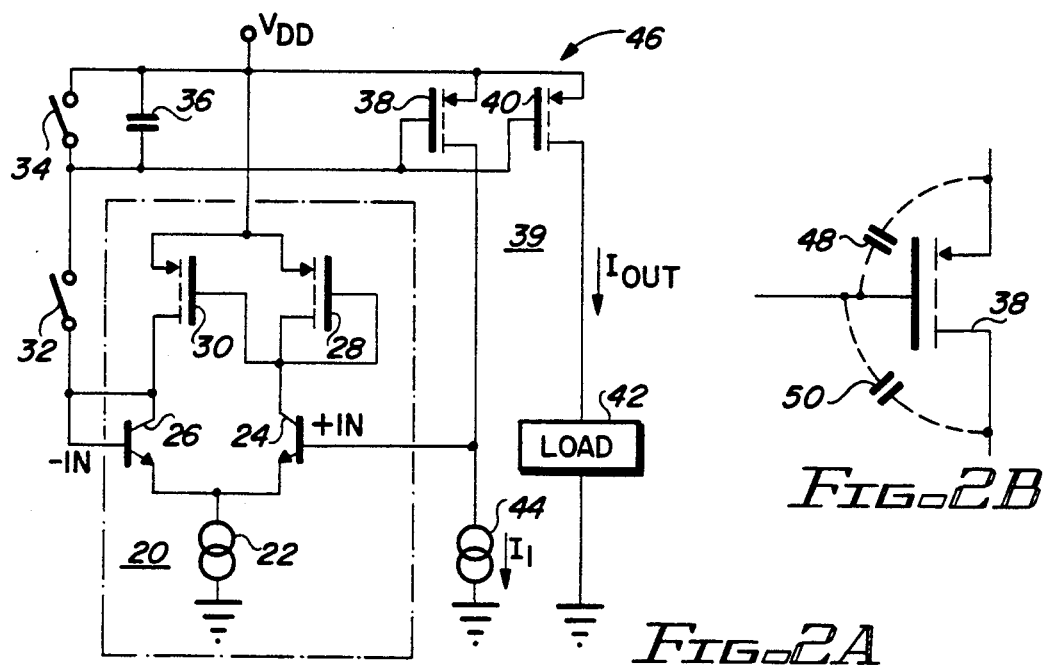
FIG-2A
FIG-2B
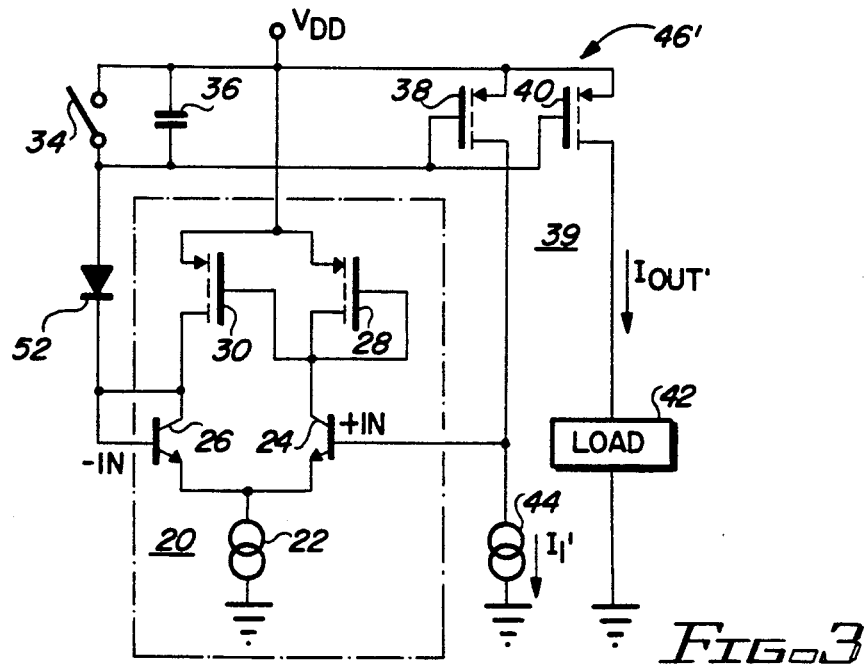
FIG-3

CURRENT MODE SAMPLE-AND-HOLD CIRCUIT

FIELD OF THE INVENTION

This invention relates generally to the field of semiconductor sample-and-hold circuits and more particularly, to a monolithically integrated current mode sample-and-hold circuit for sampling an input current and providing an output current therefrom.

BACKGROUND OF THE INVENTION

Digital and analog circuits, when processing signals, must often store a signal at one instant to be made available at a later instant. In many such signal processing circuits the signal is stored for a long time. A basic storage requirement includes maintaining the signal's original voltage or current magnitude. Digital circuits generally present a simple problem since the voltage levels stored typically have one of two magnitudes, i.e., a binary zero or a binary one. Some attenuation of a binary signal over time is not problematic since the voltage magnitude is easily restored to its original magnitude by a simple buffer circuit. Commonly used digital storage circuits include dynamic random access memory (DRAM) and shift registers. Analog signal storage, on the other hand, often presents a more difficult problem since the stored analog signals can have a continuum of voltage or current magnitudes. Attenuation of a stored analog signal is therefore undesirable. Many sample-and-hold circuits exist for temporarily storing an analog voltage signal. Semiconductor integrated circuits provide high quality capacitors and switches that are useful for capturing and storing voltages. A simple voltage mode sample-and-hold circuit includes a switch for coupling and decoupling a voltage to be sampled to a capacitor. The switch may be a metal oxide field effect transistor (MOSFET) which appears as an open circuit while in an off state and as a short circuit while in an on state (ideally). A capacitor is made available, for example, by a metal layer separated from a polysilicon or diffusion layer by an insulator such as silicon dioxide.

The MOSFET is turned on coupling an input voltage to be sampled to the capacitor, and the capacitor in turn charges to the magnitude of the input voltage. At the moment the input voltage is to be sampled the MOSFET is turned off, thereby decoupling the capacitor from the input voltage. The capacitor continues to store the charge thus holding the sampled input voltage. Leakage currents inherent in the capacitor insulating materials and switching device, cause charge attenuation over time. The attenuation limits the useful period for accurately holding the sample. Further refinements to the simple voltage mode sample-and-hold circuit include adding amplifiers at the input and output for providing a high impedance at the input and a low impedance at the output. An input buffer improves bandwidth since the capacitor can charge faster, i.e., a reduced RC time constant. A low output impedance reduces loading effects.

A voltage mode sample-and-hold circuit, disclosed by Hands, et al., in U.S. Pat. No. 3,469,112, consists of a dual stage unity gain operational amplifier having a storage capacitor connected to an inverting input. The storage capacitor charges to an input voltage level defined by an input signal applied to a non-inverting input. The storage capacitor subsequently drives an output load directly. The sample-and-hold circuit taught by Hands et al, therefore, is a voltage-in, voltage-out type of sample-and-hold circuit. Furthermore, the storage capacitor is buffered from the input signal and forms part of a feedback loop. There are numerous voltage-in, voltage-out sample-and-hold circuits disclosed that are similar to that disclosed by Hands, et al. Kurcharewski, for example, in U.S. Pat. No. 4,185,211, discloses a circuit which uses a transconductance amplifier with feedback for similarly charging the storage capacitor.

Another similar voltage mode sample-and-hold circuit is set forth in U.S. Pat. No. 4,321,488 by Srivastava, wherein the input voltage is sampled by switching off the bias supply to isolate the storage capacitor during the hold mode. Murayama, et al., provide a variation on Srivastava's circuit wherein low voltage operation is made possible by incorporating a folded current mirror as disclosed in U.S. Pat. No. 5,004,935. A voltage mode sample-and-hold circuit taught by Thompson, in U.S. Pat. No. 3,643,110, uses one of two differential amplifiers as a switch for discharging the storage capacitor. Thompson thus teaches using separate charge and discharge paths for the storage capacitor. Different variations on the voltage mode sample-and-hold circuit are disclosed by Saito in Japanese Patent 63-109661, and by Matsuura in Japanese Patent 63-304099. Saito and Matsuura each teach coupling the storage capacitor directly to the input signal to be sampled, i.e., in an open loop operating mode. The output voltage, on the other hand, is isolated from the storage capacitor to increase control of the output voltage.

While there are many voltage mode sample-and-hold circuits available, storing analog signals as currents is also very desirable. A current mode sample-and-hold circuit can potentially offer improved accuracy and increased bandwidths since the currents are less affected by stray capacitances and IR (current * resistance) drops. A very simple current mode sample-and-hold circuit would include a switch coupled to an inductor, wherein the inductor would temporarily store a current flowing through the inductor. There exists several limitations, including short storage times, and destructive voltage spikes due to rapidly changing current flow. Additionally, inductors are not readily available in monolithically integrated form.

Alternately, a current mode sample-and-hold circuit may be realized by sampling an input current, linearly converting the sample into a voltage and storing the voltage across a storage capacitor, and finally, converting the stored voltage to an output current. FIG. 1 depicts a proposed current mode sample-and-hold circuit that converts a current into a voltage and back into a current again. This circuit, however, introduces errors in the conversion process and limits frequency to the performance of the operational amplifiers. Removing the operational amplifiers can enhance frequency response, but the sample-and-hold circuit would then have increased conversion inaccuracies and undesirable loading effects.

A current mode sample-and-hold circuit that converts an input current into a voltage and then converts the voltage into an output current is described by Hughes in U.S. Pat. No. 5,012,133. Hughes' invention consists of a collection of current conveyors, wherein a current conveyor is a three terminal device similar to a current mirror but having a low input impedance. Each current conveyor samples an input current and converts the sampled current to a voltage for storage. By providing a plurality of current conveyors, a current sample of a previous period may be added to a current sample of a later period. In Hughes' implementation, however, a bias current is added to the sampled current which must be subtracted. Furthermore, the input current acquisition is made in an open loop mode, and no buffering or amplification of the input current is provided.

Thus what is needed is a current mode sample-and-hold circuit for acquiring an input current in a closed loop mode, and directly converting that input current into a representative output current.

SUMMARY OF THE INVENTION

Accordingly, it is an object of the present invention to provide an improved current mode sample-and-hold circuit.

Another object of the present invention is to provide a current mode sample-and-hold circuit wherein a storage capacitor is isolated from both the input signal and the output load.

Yet another object of the present invention is to provide a current mode sample-and-hold circuit wherein a storage capacitor operates in a closed loop.

Still another object of the present invention is to provide a current mode sample-and-hold circuit that can provide a peak detector function.

These and other objects of this invention are accomplished by a monolithically integrated current mode sample-and-hold circuit including a differential amplifier having an inverting input coupled to an output, and a non-inverting input coupled to a first leg of a current mirror. An input current, to be sampled, is coupled to the non-inverting input such that the input current is drawn from the first leg thus pulling the voltage down at the non-inverting input accordingly. A storage capacitor is operatively coupled to the output and the inverting input of the differential amplifier. A charging current passes through the storage capacitor and into the differential amplifier until a voltage at an inverting input equals the voltage at the non-inverting input, and hence a steady state is reached. The storage capacitor biases the current mirror, and hence the first current leg, thereby operating in a closed loop.

A second leg of the current mirror is also biased by the storage capacitor. When the storage capacitor is operatively decoupled from the differential amplifier, the charge stored thereacross maintains the bias on the current mirror and the second current leg continues to provide an output current representative of the sampled input current.

The differential amplifier provides gain while isolating the storage capacitor from the input current. Since the storage capacitor operates in a single feedback loop with the input current, acquisition is accurate. Furthermore, the storage capacitor is isolated from the output current. The input current is directly converted into an output current thereby removing the frequency limitations and inaccuracies of voltage conversion. Coupling the storage capacitor to the differential amplifier by a diode converts the sample-and-hold function into a peak detector function.

The foregoing and other objects, features and advantages of the invention will be apparent from the following more particular description of the preferred embodiment of the invention, as illustrated in the accompanying drawing.

BRIEF DESCRIPTION OF THE DRAWING

FIG. 1 is a schematic diagram of a current mode sample-and-hold circuit that converts an input current into a voltage for storage, and converts the stored voltage to an output current.

FIG. 2A is a schematic diagram of a first embodiment of a current mode sample-and-hold circuit.

FIG. 2B is a schematic diagram of a transistor as used in the first embodiment with parasitic capacitances depicted.

FIG. 3 is a schematic diagram of a peak detector according to the present invention.

DESCRIPTION OF THE PREFERRED EMBODIMENT

Figure 4:
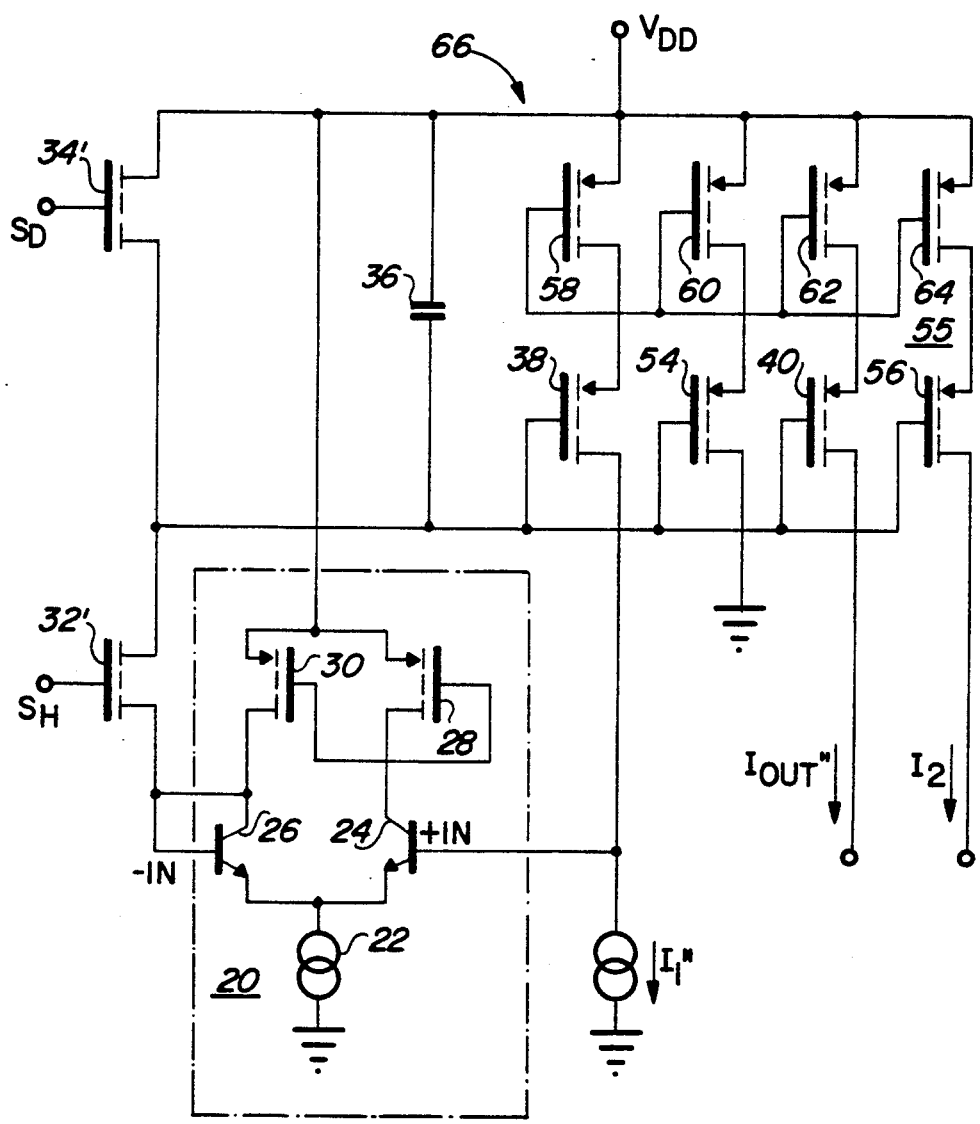
FIG. 4 is a schematic diagram of a preferred embodiment of a current mode sample-and-hold circuit having a current mirror with stacked devices.

Like devices in the several figures are identified with like numerals. FIG. 1 depicts a current mode sample-and-hold circuit 16 having an operational amplifier 4 connected for receiving an input current, $i_{in}$. Disconnecting the operational amplifier 4 from a capacitor 8, by opening a switch 6, impresses a voltage across the capacitor 8 that is representative of $i_{in}$ just prior to being decoupled. The operational amplifier 4, therefore, converts the sampled input current into a voltage. The voltage stored across the capacitor 8 is made available to an operational amplifier 10 which converts the voltage back to a current, $i_{out}$. In effect, an input current has been sampled and a representative output current has been provided. Desirably, the operational amplifier 4 provides a high impedance input, and the operational amplifier 10 provides a low impedance output. Additionally, the capacitor 8 is isolated from both the input and the output.

While the current mode sample-and-hold circuit 16 may effectively provide current sampling and holding, there are several undesirable characteristics associated therewith. First, the capacitor 8 does not form a feedback loop with the input current, but instead, the capacitor 8 operates in an open loop. The open loop acquisition results in errors. Second, the linear conversion from a current to a voltage and back to a current results in additional errors. Furthermore, the operational amplifiers 4 and 10, connected in a unity gain configuration, limit the bandwidth of the current mode sample-and-hold circuit 16. Improvements in speed and accuracy can be realized by using less complex devices than the operational amplifiers for providing gain, wherein bandwidth limiting compensation can be avoided; by not requiring a linear conversion of current to voltage; and by providing feedback in the acquisition of the input current sample.

Referring now to FIG. 2A, a first embodiment of the present invention, a current mode sample-and-hold circuit 46, is shown which overcomes the problems of the current mode sample-and-hold circuit 16. A simple differential amplifier 20 provides suitable gain for an input current $I_1$. The differential amplifier 20, having a bias supply 22, and transistors 24, 26, 28, and 30, receives $I_1$ at a non-inverting input, and has an inverting input connected to an output. A storage capacitor 36 is coupled between a supply voltage $V_{DD}$ and the output of the differential amplifier 20 by a switch 32 (hereinafter referred to as the sample hold switch 32). Although the capacitor 36 is shown connected to $V_{DD}$, as will become apparent, the capacitor 36 may be anchored to other fixed supply voltages. A switch 34 (hereinafter referred to as the sample dump switch 34), is coupled across the capacitor 36 for discharging any charge stored by the capacitor 36. A current mirror 39 includes transistors 38 and 40 for supplying currents $I_1$ and $I_{OUT}$, respectively. The transistors 38 and 40 each have a source connected to $V_{DD}$, and a gate connected to the capacitor 36. The drain of the transistor 38 provides a first current leg and is connected to the non-inverting input. Similarly, the drain of the transistor 40 provides a second current leg and is connected to a load 42.

FIG. 2B shows the transistor 38 having parasitic capacitances of interest identified. A gate to source capacitance, $C_{GS}$, is shown as capacitor 48, and a gate to drain capacitance, $C_{GD}$, is shown as capacitor 50. Similar capacitances are associated with the transistor 40. These parasitic capacitances, in an alternative embodiment, could provide the function of the capacitor 36, and hence replace the capacitor 36.

In operation, the sample dump switch 34 is opened and the sample hold switch 32 is closed. Initially no charge is stored across the capacitor 36 and the voltage at the inverting input is equal to $V_{DD}$. The current to be sampled, $I_1$, attempts to draw current from the drain of the transistor 38. This forces the voltage at the non-inverting input to fall, thereby creating an imbalance with the inverting input. As a result, the transistor 24 is biased off which in turn biases the transistors 28 and 30 off. Substantially all amplifier current flowing in the differential amplifier 20 is thus flowing through the transistor 26 and the bias supply 22. Having closed the sample hold switch 32, the amplifier current also flows through and charges the capacitor 36. Charging the capacitor 36 causes the voltage at the inverting input to fall, approaching the magnitude of the voltage at the non-inverting input. Eventually, the voltages at the inverting and non-inverting inputs begin to balance. Also, as the capacitor 36 charges, the transistor 38 becomes biased on as necessary to supply the current $I_1$. Very importantly, the voltage (or charge) stored across the capacitor 36 may be nonlinear with respect to the current $I_1$. The process continues until an equilibrium condition is reached in the current mode sample-and-hold circuit 46.

The current $I_1$ is held by opening the sample hold switch 32 (the sample dump switch 34 has been held open continuously), operatively decoupling the capacitor 36 from the differential amplifier 20. The capacitor 36 maintains the charge previously acquired (excluding for the moment a small leakage current) so that the bias on the transistor 38 is maintained substantially equal to the bias necessary to maintain the current $I_1$ at the moment the sample hold switch 32 was opened. Decoupling the capacitor 36 from the differential amplifier 20 also decouples the capacitor 36 from the influence of the current $I_1$. Therefore, even if $I_1$ changes, the charge on the capacitor 36 remains constant. The transistor 40 is biased identically to the transistor 38 by the capacitor 36, and hence the transistor 40 will continue to provide the current $I_{OUT}$. If the transistor 40 is sized identically to the transistor 38, i.e., the same gate lengths and widths, then $I_{OUT}$ will substantially equal $I_1$ at the moment $I_1$ was sampled. Alternatively, the transistor 40 can be sized to equal some ratio of the transistor 38, i.e., having equal gate lengths but having a gate width half the width of that of the transistor 38, will result in a corresponding scaling of the current $I_{OUT}$ relative to $I_1$.

$I_{OUT}$ will be maintained, even in the absence of $I_1$, due to the bias signal stored by the capacitor 36. Thus, an input current has been sampled, and a corresponding output current has been provided directly therefrom. Given an ideal capacitor 36, switches 32 and 34, and transistors 38 and 40, $I_{OUT}$ could be maintained indefinitely. However, due to an inherent leakage current, the bias signal will discharge over time. The discharge time due to leakage currents is typically very long and has no significant effect on most signal processing applications.

Closing the sample dump switch 34 causes the capacitor 36 to discharge, thereby resetting the sample-and-hold circuit 46. Initially, this causes the voltage at the inverting input to decrease and the voltage at the non-inverting input to increase. Current is thus forced to flow into the capacitor 36 reducing the voltage (bias signal). The transistor 40 (and the transistor 38) will be biased off so that no current $I_{OUT}$ flows. Opening the sample dump switch 34 and closing the sample hold switch 32 begins the sample hold cycle again as described above.

FIG. 3 depicts a peak detector 46' as an alternative embodiment to the current mode sample-and-hold circuit 46. The peak detector 46' is identical to the current mode sample-and-hold circuit 46 with the exception of having the sample hold switch 32 replaced by a diode 52. The diode 52 has an anode coupled to $V_{DD}$ by the capacitor 36 and a cathode connected to the output of the differential amplifier 20. The peak detector 46' operates very similarly to the current mode sample-and-hold circuit 46. Whenever a current $I_{1'}$ increases beyond a previous level, the voltage at the non-inverting input is pulled down causing the differential amplifier to conduct a current through the capacitor 36 and hence through the diode 52. The transistors 38 and 40 are biased by the capacitor 36 accordingly. Should the current $I_{1'}$ fall below a previous peak value, the diode 52 will be reverse biased and will not conduct. Hence, the diode 52 operatively decouples the differential amplifier from the capacitor 36 much like opening the sample hold switch 32. As a result, the capacitor 36 maintains a bias signal necessary to provide a current $I_{OUT}$ according to the peak current magnitude of $I_{1'}$. The sample dump switch 34 is closed to reset the peak detector 46' for detecting a subsequent peak magnitude of $I_{1'}$.

Referring now to FIG. 4, a current mode sample-and-hold circuit 66 is shown in a preferred embodiment. The current mode sample-and-hold circuit 66 is similar to the current mode sample-and-hold circuit 46 except the switches 32 and 34 are replaced by transistors 32' and 34', and the current mirror 39 is replaced by a current mirror 55. The output impedance of the current mirror 39 is the largest single contributor to error in the current mode sample-and-hold circuit 46. The current mirror 55 uses stacked transistors for increasing the output impedance thus improving accuracy. The current mirror 55 also provides an additional current leg. The transistor 34' has a source connected to $V_{DD}$, a gate connected to a logic signal sample dump, and a drain coupled to $V_{DD}$ by the capacitor 36. The transistor 32' has a drain connected to the drain of the transistor 34', a gate connected to a logic signal sample hold, and a source connected to the output and inverting input of the differential amplifier 20.

A current to be sampled, $I_{1''}$, is connected to the non-inverting input of the differential amplifier 20 and to a drain of the transistor 38. The current mirror 55, in addition to providing a current $I_{OUT'}$ from the drain of the transistor 40, provides another current $I_2$ through the drain of a transistor 56. Double stacked transistors 58, 60, 62, and 64 each have a source connected to $V_{DD}$, and a gate connected to a source of the transistor 54. Transistors 38, 40, 54 and 56 each have a gate connected to the drain of the transistor 32', and a source connected to a drain of the transistor 58, 60, 62, and 64, respectively. Also, the transistor 54 has a drain connected to a ground supply voltage. $I_{OUT''}$ can be made to equal $I_{1''}$ by making the transistors 40 and 62 the same sizes as the transistors 38 and 58 respectively. Similarly $I_2$ can be made to equal $I_{1''}$ by sizing transistors 56 and 64 the same as the transistors 38 and 58, respectively. Alternatively, the currents $I_{OUT''}$ and $I_2$ can be scaled to be some predetermined ratio of $I_{1''}$ by sizing the transistors 40, 56, 62 and 64 accordingly.

The current mode sample-and-hold circuit 66 operation is identical to that already described regarding the current mode sample-and-hold circuit 46 except that the sample hold and sample dump signals control the conduction and non-conduction of the transistors 32' and 34', respectively. Furthermore, a peak detector may be realized simply by replacing the transistor 32' by a diode. Additional output currents can be provided in any of the embodiments by adding additional current legs in the current mirrors 39 or 55. The current mode sample-and-hold circuits described herein require only a simple differential amplifier, a single capacitor, and sample hold and dump switches. High accuracy is ensured through a feedback loop starting at the non-inverting input, through the differential amplifier 20, continuing through the sample hold switch 32 or transistor 32', and finally through the current mirror 39 or 55. No stability compensation is required and speed is limited only by the bias supply 22 and capacitor 36.

While the invention has been particularly described with reference to particular embodiments thereof, it will be understood by those skilled in the art that various other changes in detail may be made therein without departing from the spirit, scope, and teaching of the invention. For example, the preferred embodiment as shown in FIG. 4, may have all active devices complemented and the voltage supplies reversed. Also, for signal processing applications having long delays between successive current samples, the switch 34 or transistor 34' could be omitted as the capacitor 36 will sufficiently discharge over time. In the current mode sample-and-hold circuit 66 of FIG. 4, the output impedance was increased by using double stacked transistors, but those skilled in the art will realize the impedance may similarly be increased by extending the transistor gate lengths. Also, as is well known to those skilled in the art, the transistors 32' and 34' could be replaced by transmission gates for nullifying capacitive coupling errors.

Accordingly, the invention herein disclosed is to be limited only as specified in the following claims.

What is claimed is:

1. A monolithically integrated current mode sample-and-hold circuit, comprising:
   amplifier means having an output for providing a gain, wherein said amplifier means is a differential amplifier having a first input which is an inverting input, and a second input which is a non-inverting input, wherein the first input is coupled to the output;
   current mirror means having a first leg coupled to the said amplifier means from which a first current to be sampled is drawn, and having a second leg for providing a second current; and
   charging means operatively coupled to the output of said amplifier means operating in a closed loop for storing a bias signal, the bias signal biasing said current mirror means such that the first leg supplies the first current, and the second leg continues to supply the second current, which is representative of the first current, after operatively decoupling said charging means from said amplifier means, wherein said charging means is a parasitic capacitance of said current mirror means.

2. The sample-and-hold circuit according to claim 1 further comprising a diode for operatively coupling said charging means to the differential amplifier output.

3. The sample-and-hold circuit according to claim 1 further comprising a switch for operatively coupling said charging means to the differential amplifier output.

4. The sample-and-hold circuit according to claim 3 wherein said switch is a transistor.

5. The sample-and-hold circuit according to claim 4 further comprising a second switch coupled to said charging means for resetting the bias signal thereby enabling the sample-and-hold circuit to sample another current.

6. The sample-and-hold circuit according to claim 1 wherein said charging means is a capacitor.

7. The sample-and-hold circuit according claim 6 wherein said current mirror further comprises:
   a first transistor having a source coupled to a supply voltage, a gate coupled to said capacitor, and a drain coupled to said differential amplifier; and
   a second transistor having a source coupled to the supply voltage, a gate coupled to said capacitor, and a drain coupled for providing the second current.

8. A monolithically integrated current mode sample-and-hold circuit, comprising:
   amplifier means having an output for providing a gain;
   current mirror means having a first leg coupled to the said amplifier means from which a first current to be sampled is drawn, and having a second leg for providing a second current; and
   charging means operatively coupled to the output of said amplifier means operating in a closed loop for storing a bias signal, the bias signal biasing said current mirror means such that the first leg supplies the first current, and the second leg continues to supply the second current, which is representative of the first current, after operatively decoupling said charging means from said amplifier means, wherein said charging means is a parasitic capacitance of said current mirror means.

9. A monolithically integrated current mode sample-and-hold circuit, comprising:
   a differential amplifier having an inverting input coupled to an output thereof, and a non-inverting input;
   a current mirror having a bias terminal coupled to the output of said differential amplifier for receiving a bias signal, a first leg coupled to the non-inverting input for sinking a first current, and a second leg for providing a second current;
   charging means coupled between the output of said differential amplifier and a supply voltage for carrying a charging current that flows through said differential amplifier for determining the magnitude of the bias signal; and a first switch coupled to said charging means for resetting the bias signal.

10. The sample-and-hold circuit according to claim 9 further comprising a diode coupled between said charging means and the inverting input of said differential amplifier for causing the charging means to store a charge representing a peak magnitude of the first current.

11. The sample-and-hold circuit according to claim 9 further comprising a second switch coupled between said charging means and the output of said differential amplifier for disconnecting said differential amplifier, thereby sampling the first current.

12. The sample-and-hold circuit according to claim 11 wherein said second switch is a transistor.

13. The sample-and-hold circuit according to claim 12 wherein said charging means is a capacitor.

14. The sample-and-hold circuit according to claim 13 wherein said current mirror comprises:

a first transistor having a source coupled to a supply voltage, a gate coupled to said capacitor, and a drain coupled to said differential amplifier; and a second transistor having a source coupled to the supply voltage, a gate coupled to said capacitor, and a drain coupled for providing the second current.

15. The sample-and-hold circuit according to claim 14 wherein said current mirror further comprises:

a third transistor having a source coupled to the supply voltage, a drain coupled to the drain of said first transistor, and a gate;

a fourth transistor having a source coupled to the supply voltage, a drain coupled to the drain of said second transistor, and a gate coupled to the gate of said third transistor;

a fifth transistor having a source coupled to the supply voltage, and a gate coupled to a drain and to the gate of said fourth transistor; and a sixth transistor having a drain coupled to the drain of said fifth transistor, a gate coupled to the gate of said first transistor, and a source coupled to another supply voltage.

16. The sample-and-hold circuit according to claim 15 wherein said second and fourth transistors are a predetermined ratio of said first and third transistors, respectively.

17. The sample-and-hold circuit according to claim 9 wherein said charging means is a parasitic capacitance of said first transistor.

18. A monolithically integrated current mode sample-and-hold circuit, comprising:

a differential amplifier having an inverting input coupled to an output thereof, and a non-inverting input;

a current mirror having a bias terminal for receiving a bias signal, a first current carrying leg coupled to the non-inverting input for sinking a first current, and a second current carrying leg for providing a second current;

a first switch having a first terminal coupled to the output of said differential amplifier, and a second terminal coupled to the bias terminal;

a capacitor coupled between a first supply voltage and the bias terminal for carrying a charging current that flows through the differential amplifier and defines the magnitude of the bias signal; and a second switch coupled across said capacitor for resetting the bias signal.

19. The current mode sample-and-hold circuit according to claim 18 wherein said current mirror further comprises:

a first transistor having a gate coupled to said bias terminal, a drain coupled to said differential amplifier, and a source; and a second transistor having a gate coupled to said bias terminal, a drain coupled for providing the second current, and a source;

a third transistor having a source coupled to the first supply voltage, a drain coupled to the source of said first transistor, and a gate;

a fourth transistor having a source coupled to the first supply voltage, a drain coupled to the source of said second transistor, and a gate coupled to the gate of said third transistor;

a fifth transistor having a source coupled to the first supply voltage, and a gate coupled to a drain and to the gate of said fourth transistor; and a sixth transistor having a drain coupled to the drain of said fifth transistor, a gate coupled to said bias terminal, and a source coupled to a second supply voltage.

20. The sample-and-hold circuit according to claim 19 wherein said second and fourth transistors are a predetermined ratio of said first and third transistors, respectively.

21. The sample-and-hold circuit according to claim 20 wherein the second current is substantially equal to the first current.

22. The sample-and-hold circuit according to claim 20 wherein the second current is a predetermined ratio of said first current.

* * * * *